United States Patent
Wang

(10) Patent No.: US 7,037,825 B2
(45) Date of Patent: May 2, 2006

(54) DAMASCENE METHOD CAPABLE OF AVOIDING COPPER EXTRUSION

(75) Inventor: Min-Chih Wang, Taipei (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/711,259

(22) Filed: Sep. 6, 2004

(65) Prior Publication Data

US 2006/0051962 A1 Mar. 9, 2006

(51) Int. Cl.
*H01L 21/4763* (2006.01)

(52) U.S. Cl. ............. 438/637; 438/672; 438/700

(58) Field of Classification Search ............ None
See application file for complete search history.

(56) References Cited

U.S. PATENT DOCUMENTS 6,368,967 B1 * 4/2002 Besser ............... 438/687
6,486,059 B1 * 11/2002 Lee et al. ............ 438/637
6,551,915 B1 * 4/2003 Lin et al. ............ 438/598
6,764,940 B1 * 7/2004 Rozbicki et al. ........ 438/627
2005/0054202 A1 * 3/2005 Pan et al. ............ 438/694

* cited by examiner

*Primary Examiner*—Dung A. Le
(74) *Attorney, Agent, or Firm*—Winston Hsu

(57) ABSTRACT

A method for avoiding copper extrusion during a damascene process is disclosed. A semiconductor wafer including a substrate with at least one copper conductive wire on the substrate is provided. A dielectric layer on the copper conductive wire is formed. A damascene structure having an opening exposing a portion of the copper conductive wire is formed using the dielectric layer. A degassing process to make gas escape from the dielectric layer is performed. A barrier layer on portions of the exposed surface of the copper conductive wire and the damascene structure of the dielectric layer is formed. A conductive layer on the barrier layer is formed.

17 Claims, 2 Drawing Sheets

DAMASCENE METHOD CAPABLE OF AVOIDING COPPER EXTRUSION

BACKGROUND OF INVENTION

1. Field of the Invention

The present invention relates to a damascene method for fabricating a metal interconnect, and more particularly, to a damascene method capable of avoiding copper extrusion.

2. Description of the Prior Art

In conventional integrated circuits, a metal interconnect is formed using aluminum and silicon dioxide. However, aluminum and silicon dioxide metal interconnects are not suitable for today's narrower line width and faster production speeds. Therefore, in recent years, the metal interconnect is formed with a damascene structure using copper and a dielectric material. The resistance of copper is approximately lower 40% than that of aluminum. The dielectric material can reduce the capacity effect of a metal conductive wire. Therefore, the damascene structure can decrease RC delay propagating when an electrical signal transmits and increase product performance.

A damascene method for fabricating the damascene structure mainly could be sub-classified into a method for fabricating a single damascene structure and a method for fabricating a dual damascene structure. Thereof, the method for fabricating a dual damascene is more complex, as shown in FIG. 1. At least one copper conductive wire 14 is formed on a base layer 10 such as an interlayer dielectric. Although not shown, the copper conductive wire 14 could electrically connect to another conductive area below the base layer 10 through the conductive plug 12. A first dielectric layer 20 is deposited on the copper conductive wire 14. A passivation 16 further would be formed between the conductive wire 14 and the first dielectric layer 20. A stop layer 22 is formed overlying the first dielectric layer 20. A second dielectric layer 24 is deposited on the stop layer 22. A hard mask 26 is formed on second dielectric layer 24. A dual damascene structure 30, exposing a portion of the copper conductive wire 14, is formed using the hard mask 26 to etch the first dielectric layer 20 and the second dielectric layer 24. A barrier layer 50 is deposited on the surface of the exposed copper conductive wire 14, the surface of the dual damascene structure 30, and the surface of the hard mask 26. A copper layer 52 is formed on the barrier layer 50.

The first dielectric layer 20 and the second dielectric layer 24 are dielectric materials having micro-vias, and an etching gas, like $CF_4$, is used to etch the first dielectric layer 20 and the second dielectric layer 24 during fabrication of the dual damascene structure 30. As a result, some of the etching gas remains in the micro-vias, preventing the barrier layer 50 from being deposited effectively on the first dielectric layer 20 and the second dielectric layer 24. As a consequence of the etching gas remaining in the micro-vias, there may be small gaps in the barrier layer 50 or the barrier layer 50 may be incompletely formed in the areas of the remaining gas. In this situation, the subsequently formed copper layer 52 effuses out through the barrier layer 50 to form the defect of copper extrusion, as indicated by numeral 70.

SUMMARY OF INVENTION

It is therefore a primary object of the claimed invention to provide a copper damascene method capable of avoiding copper extrusion.

According to the claimed invention, a semiconductor wafer including a substrate with at least one copper conductive wire on the substrate is provided. A dielectric layer is formed on the copper conductive wire. Using the dielectric layer, a damascene structure having an opening to expose a portion of the copper conductive wire is formed. A degassing process is performed to make gas escape from the dielectric layer. A barrier layer overlying the surface of the exposed portion of the copper conductive wire and the damascene structure is formed. A copper layer overlying the barrier layer is formed.

It is an advantage that the claimed invention can avoid copper extrusion by performing a degassing process to make gas escape from the dielectric layer.

These and other objectives of the claimed invention will no doubt become obvious to those of ordinary skill in the art after reading the following detailed description of the preferred embodiment, which is illustrated in the multiple figures and drawings.

DETAILED DESCRIPTION

Figure 1:
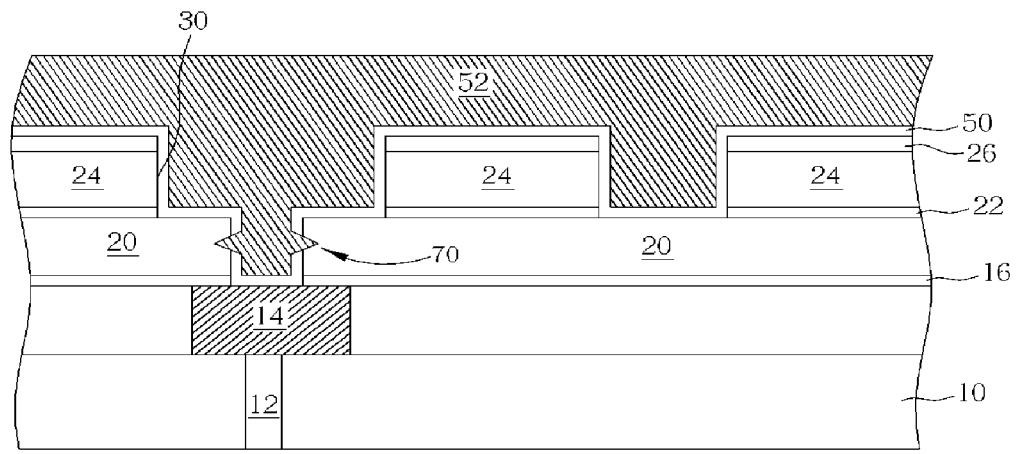
FIG. 1 shows the cross-section schematic drawing according to the dual damascene structure of the prior the art.
Figure 2:
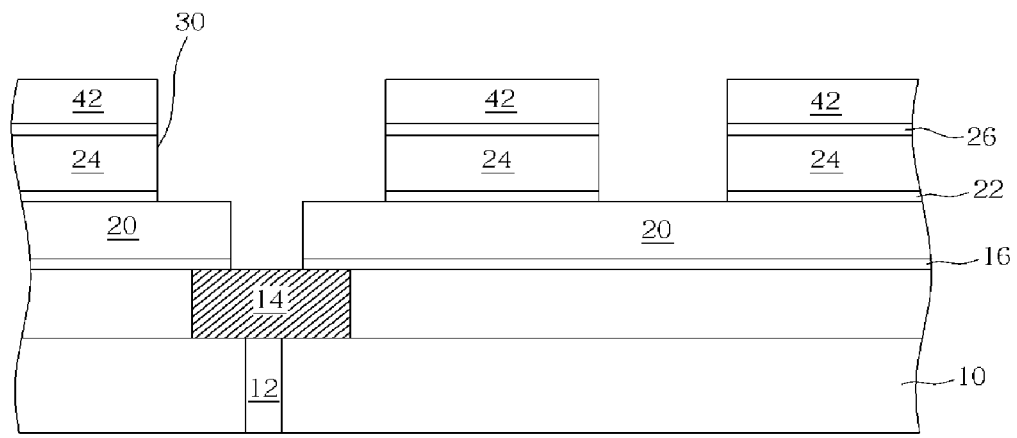
FIG. 2 to FIG. 4 show the damascene method schematics according to the present invention.
Figure 3:
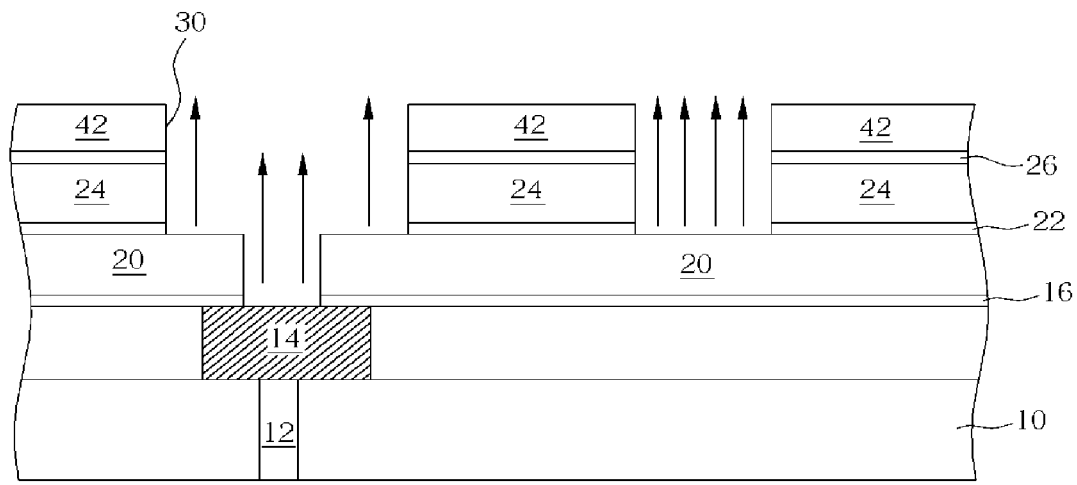
Figure 4:
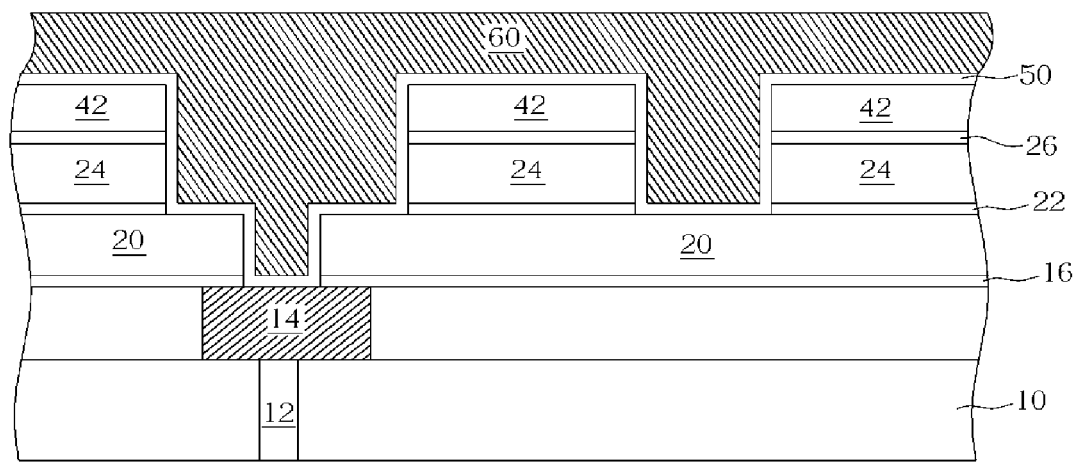

Please refer to FIG. 2 to FIG. 4, which show damascene method schematics according to the present invention that are capable of avoiding copper extrusion. In order to make the present invention apparent, the steps in FIG. 2 to FIG. 4 of the present invention similar to the prior art will use the same notations as were used in FIG. 1. It is to be understood that the dual damascene process shown through FIG. 2 to FIG. 4 is only exemplary preferred embodiment. The present invention may be applied to single damascene processes.

As shown in FIG. 2, a semiconductor wafer including a base layer 10 such as an interlayer dielectric with at least one copper conductive wire 14 on the base layer 10 is provided. Although not shown, the copper conductive wire 14 may electrically connect to a conductive area or device formed below the base layer 10 through a conductive plug 12. The copper conductive wire 14 may be a copper damascene layer. A first dielectric layer 20 on the copper conductive wire 14 is formed. A passivation layer 16 may be formed between the copper conductive wire 14 and the first dielectric layer 20. The passivation layer 16 may be made from silicon nitride.

Next, a stop layer 22, possibly made from silicon nitride, is formed overlying the first dielectric layer 20. A second dielectric layer 24 is formed on the stop layer 22. The first dielectric layer 20 and the second dielectric layer 24 are low-k dielectric layers ($k \leq 2.9$). A hard mask 26, possibly made from silicon nitride, is formed overlying the second dielectric layer 24. A dual damascene structure 30 having an opening exposing a portion of the copper conductive wire 14 is formed in the first dielectric layer 20 and the second dielectric layer 24 using the hard mask 26 as etching mask. It is to be understood that the present invention is not limited only to a dual damascene structure but also could be applied in a single damascene structure. A tetraethoxy silane (TEOS) layer 42 may be further formed on the hard mask 26 after forming the hard mask 26.

Next, as shown in FIG. 3, an annealing step is performed to heat the wafer to make gas escape from the first dielectric layer 20 and the second dielectric layer 24 as depicted by the arrows. The preferred temperature range of heating the wafer could be between 200° C. to 300° C. The annealing step could be another degassing step. The gas comprises fluorine.

Next, as shown in FIG. 4, a barrier layer 50 is formed on portions of the exposed surfaces of the copper conductive wire 14, the dual damascene structure 30 of the dielectric layers, and the tetraethoxy silane layer 42. Finally, a conductive layer 60 on the barrier layer 50 is formed. The conductive layer 60 could be a copper layer or another type of conductive layer. It is to be understood that application of the present invention is not limited only to preventing copper extrusion, but can also be utilized to avoid extrusion by other conductive materials.

Compared with the prior art, the gas remaining in the dielectric layers can escape due to a degassing step in the present invention. Therefore, the present invention can deposit the barrier layer effectively on the exposed surfaces of the dual damascene structure of the dielectric layers to avoid copper extrusion.

Those skilled in the art will readily observe that numerous modifications and alterations of the method may be made while retaining the teachings of the invention. Accordingly, the above disclosure should be construed as limited only by the metes and bounds of the appended claims.

The invention claimed is:

1. A damascene method capable of avoiding copper extrusion, the damascene method comprising:
   providing a semiconductor wafer including a substrate with at least one metal layer on the substrate;
   depositing a dielectric layer on the metal layer;
   forming a damascene recess structure having an opening exposing a portion of the metal layer in the dielectric layer;
   performing an annealing step to remove trapped gas from the dielectric layer;
   forming a barrier layer on portions of the exposed surface of the metal layer and on the damascene recess structure; and
   forming a conductive layer on the barrier layer.

2. The method of claim 1 wherein the trapped gas comprises fluorine-containing gas.

3. The method of claim 1 wherein the annealing step is performed at a temperature in a range between 200° C. to 300° C.

4. The method of claim 1 wherein a passivation layer is formed between the metal layer and the dielectric layer.

5. The method of claim 4 wherein the passivation layer is substantially made from silicon nitride.

6. The method of claim 1 wherein the dielectric layer is a laminate compound layer comprising a first low-k dielectric, a stop layer over the first low-k dielectric, a second low-k dielectric, and a hard mask layer.

7. The method of claim 1 wherein the metal layer is made of copper or tungsten.

8. The method of claim 1 wherein the damascene recess structure is a dual damascene recess.

9. A damascene method capable of avoiding conductive material extrusion, the damascene method comprising:
   providing a substrate;
   forming a plurality of devices on the substrate;
   forming an interlayer dielectric to encapsulate the plurality of devices;
   forming a plurality of conductive plugs in the interlayer dielectric to connect the devices on the substrate;
   forming a dielectric layer having an embedded metal layer therein over the interlayer dielectric;
   forming a low-k dielectric film over the dielectric layer;
   etching a damascene recess structure in the low-k dielectric film, the damascene recess structure communicating the embedded metal layer;
   executing an annealing step to expel gas contained by the low-k dielectric film;
   forming a barrier layer covering surface of the damascene recess structure and surface of the low-k dielectric film; and
   depositing a conductive layer over the barrier layer.

10. The method of claim 9 wherein the gas contained by the low-k dielectric film is fluorine-containing gas.

11. The method of claim 9 wherein the annealing step is executed within a temperature range between 200° C. to 300° C.

12. The method of claim 9 wherein the conductive layer is a copper layer.

13. The method of claim 9 wherein between the embedded metal layer and the low-k dielectric layer, a passivation layer is formed.

14. The method of claim 13 wherein the passivation layer is substantially made from silicon nitride.

15. The method of claim 9 wherein the low-k dielectric layer has a dielectric constant (k) that is less than 2.9.

16. The method of claim 9 wherein the low-k dielectric film is a laminate compound layer comprising a first low-k dielectric, a stop layer over the first low-k dielectric, a second low-k dielectric, and a hard mask layer.

17. The method of claim 9 wherein the damascene recess structure is a dual damascene recess.

* * * * *